(12) United States Patent
Riedel

(10) Patent No.: US 9,748,278 B2
(45) Date of Patent: Aug. 29, 2017

(54) SUPPRESSING LEAKAGE CURRENTS IN A MULTI-TFT DEVICE

(71) Applicant: FLEXENABLE LIMITED, Cambridge (GB)

(72) Inventor: Stephan Riedel, Dresden (DE)

(73) Assignee: FLEXENABLE LIMITED, Cambridge (GB)

(*) Notice: Subject to any disclaimer, the term of this patent is extended or adjusted under 35 U.S.C. 154(b) by 0 days.

(21) Appl. No.: 14/901,758

(22) PCT Filed: Jul. 1, 2014

(86) PCT No.: PCT/EP2014/063937
§ 371 (c)(1),
(2) Date: Dec. 29, 2015

(87) PCT Pub. No.: WO2015/000884
PCT Pub. Date: Jan. 8, 2015

(65) Prior Publication Data
US 2016/0372488 A1  Dec. 22, 2016

(30) Foreign Application Priority Data
Jul. 1, 2013 (GB) .................................. 1311772.6

(51) Int. Cl.
*H01L 27/12* (2006.01)
*H01L 23/522* (2006.01)
*H03K 17/16* (2006.01)

(52) U.S. Cl.
CPC ........ *H01L 27/124* (2013.01); *H01L 23/5222* (2013.01); *H03K 17/161* (2013.01); *H03K 2217/0036* (2013.01)

(58) Field of Classification Search
CPC . H01L 27/124; H01L 23/5222; H03K 17/161; H03K 2217/0036
(Continued)

(56) References Cited

U.S. PATENT DOCUMENTS

2002/0028541 A1* 3/2002 Lee .................... G11C 16/3427
                                                          438/149
2002/0106847 A1* 8/2002 Kazlas .................... H01L 28/60
                                                          438/200
(Continued)

FOREIGN PATENT DOCUMENTS

EP  1 675 196 A1  6/2006
EP  2 015 379 A2  1/2009
WO  01/15233 A1  3/2001

OTHER PUBLICATIONS

International Search Report of PCT/EP2014/063937 dated Sep. 10, 2014.
(Continued)

*Primary Examiner* — Brandon S Cole
(74) *Attorney, Agent, or Firm* — Sughrue Mion, PLLC

(57) ABSTRACT

A technique of operating a device comprising a patterned conductor layer defining source electrode circuitry and drain electrode circuitry for a plurality of transistors; a semiconductor layer providing a respective semiconductor channel for each transistor between source electrode circuitry and drain electrode circuitry; and gate electrode circuitry overlapping the semiconductor channels of the plurality of transistor devices for switching the semiconductor channels between two or more levels of conductance; wherein the technique comprises using one or more further conductors independent of said gate electrode circuitry to capacitatively induce a reduction in conductivity of said one or more areas of said semiconductor layer outside of said semiconductor channels.

7 Claims, 2 Drawing Sheets

(58) Field of Classification Search
USPC .................................................. 327/365–508
See application file for complete search history.

(56) References Cited

U.S. PATENT DOCUMENTS

| | | | |
|---|---|---|---|
| 2003/0160236 A1* | 8/2003 | Yamazaki | G02F 1/13452 |
| | | | 257/53 |
| 2004/0017162 A1* | 1/2004 | Sato | H01L 27/3276 |
| | | | 315/169.3 |
| 2008/0023703 A1 | 1/2008 | Hoffman et al. | |
| 2011/0017971 A1* | 1/2011 | Kim | H01L 27/10876 |
| | | | 257/5 |
| 2011/0063014 A1* | 3/2011 | Koyama | H03K 19/0013 |
| | | | 327/427 |
| 2014/0131556 A1* | 5/2014 | Abukawa | H01L 27/14636 |
| | | | 250/208.2 |

OTHER PUBLICATIONS

Written Opinion of the International Searching Authority of PCT/EP2014/063937 dated Sep. 10, 2014.
Y. Hirano et al., "Analyses of the Radiation Caused Characteristics Change in SOI MOSFETS Using Field Shield Isolation," Extended Abstracts of the International Conference on Solid State Devices and Materials, Japan Society of Applied Physics, Sep. 1, 1998, pp. 314-315.

* cited by examiner

SUPPRESSING LEAKAGE CURRENTS IN A MULTI-TFT DEVICE

CROSS REFERENCE TO RELATED APPLICATIONS

This is a National Stage of International Application No. PCT/EP2014/063937 filed Jul. 1, 2014, claiming priority based on British Patent Application No. 1311772.6 filed Jul. 1, 2013, the contents of all of which are incorporated herein by reference in their entirety.

A device comprising a plurality of TFTs typically comprises a patterned conductor layer defining source electrode circuitry and drain electrode circuitry for the plurality of TFTs, and a semiconductor layer providing respective semiconductor channels between the respective combination of source and drain electrodes for each TFT. Gate electrode circuitry capacitatively coupled with the semiconductor layer is used to switch the semiconductor channels between two or more levels of conductance.

It can be desirable to reduce leakage currents between the source and drain electrode circuitry in areas outside the area of the gate electrode circuitry.

One technique for reducing such leakage currents involves depositing a blanket layer of semiconductor material over the source/drain electrode circuitry for all the plurality of transistors, and then removing portions of the semiconductor layer by e.g. laser ablation in one or more areas outside the semiconductor channels.

Another technique for reducing such leakage currents involves depositing the semiconductor layer as a plurality of islands, each island providing the semiconductor channel for a respective TFT but unconnected within the semiconductor layer to any of the other islands.

There has been identified the challenge of providing a new technique for reducing leakage currents.

There is hereby provided a method of operating a device comprising a patterned conductor layer defining source electrode circuitry and drain electrode circuitry for a plurality of transistors; a semiconductor layer providing a respective semiconductor channel for each transistor between source electrode circuitry and drain electrode circuitry; and gate electrode circuitry overlapping the semiconductor channels of the plurality of transistor devices for switching the semiconductor channels between two or more levels of conductance; wherein the method comprises using one or more further conductors independent of said gate electrode circuitry to capacitatively induce a reduction in conductivity of said one or more areas of said semiconductor layer outside of said semiconductor channels.

In one embodiment, said one or more areas of the semiconductor layer include one or more areas outside the area of the gate electrode circuitry.

In one embodiment, said one or more areas include one or more areas where the source and drain electrode circuitry is closest to each other outside the area of the gate electrode circuitry.

In one embodiment, the method further comprises: capacitatively inducing a reduction in conductivity of said one or more areas of said semiconductor layer whilst simultaneously using said gate electrode circuitry to capacitatively induce a change in conductivity of one or more of said semiconductor channels.

In one embodiment, said one or more further conductors are provided on the opposite side of the patterned conductor layer to the gate electrode circuitry.

In one embodiment, said one or more further conductors comprises a conductor layer extending over substantially all of the area between the source and drain electrode circuitry for the plurality of transistors except for the semiconductor channels.

There is also hereby provided a control device, comprising: a first patterned conductor layer defining source electrode circuitry and drain electrode circuitry for a plurality of transistor devices; a semiconductor layer providing a respective semiconductor channel for each transistor device between source electrode circuitry and drain electrode circuitry for the same transistor device; a second patterned conductor layer defining gate electrode circuitry for capacitative coupling with the semiconductor channels of the plurality of transistor devices and switching the semiconductor channels between two or more levels of conductance; wherein said semiconductor layer extends beyond said semiconductor channels to other areas between said source electrode circuitry and drain electrode circuitry; and wherein the device further comprises a third patterned conductor layer arranged on the opposite side of the semiconductor layer to the second patterned conductor layer, wherein the third patterned conductor layer extends over substantially the whole area between the source and drain electrode circuitry for the plurality of transistors, except for the semiconductor channels.

An embodiment of the present invention is described below, by way of example only, with reference to the accompanying drawings, in which:—

FIG. 1 is a plan view of part of a TFT array according to an embodiment of the present invention. Only 4 TFTs are shown in FIG. 1 for simplicity but a TFT array for controlling an pixellated optical display would typically comprises thousands of TFTs.

Figure 1:
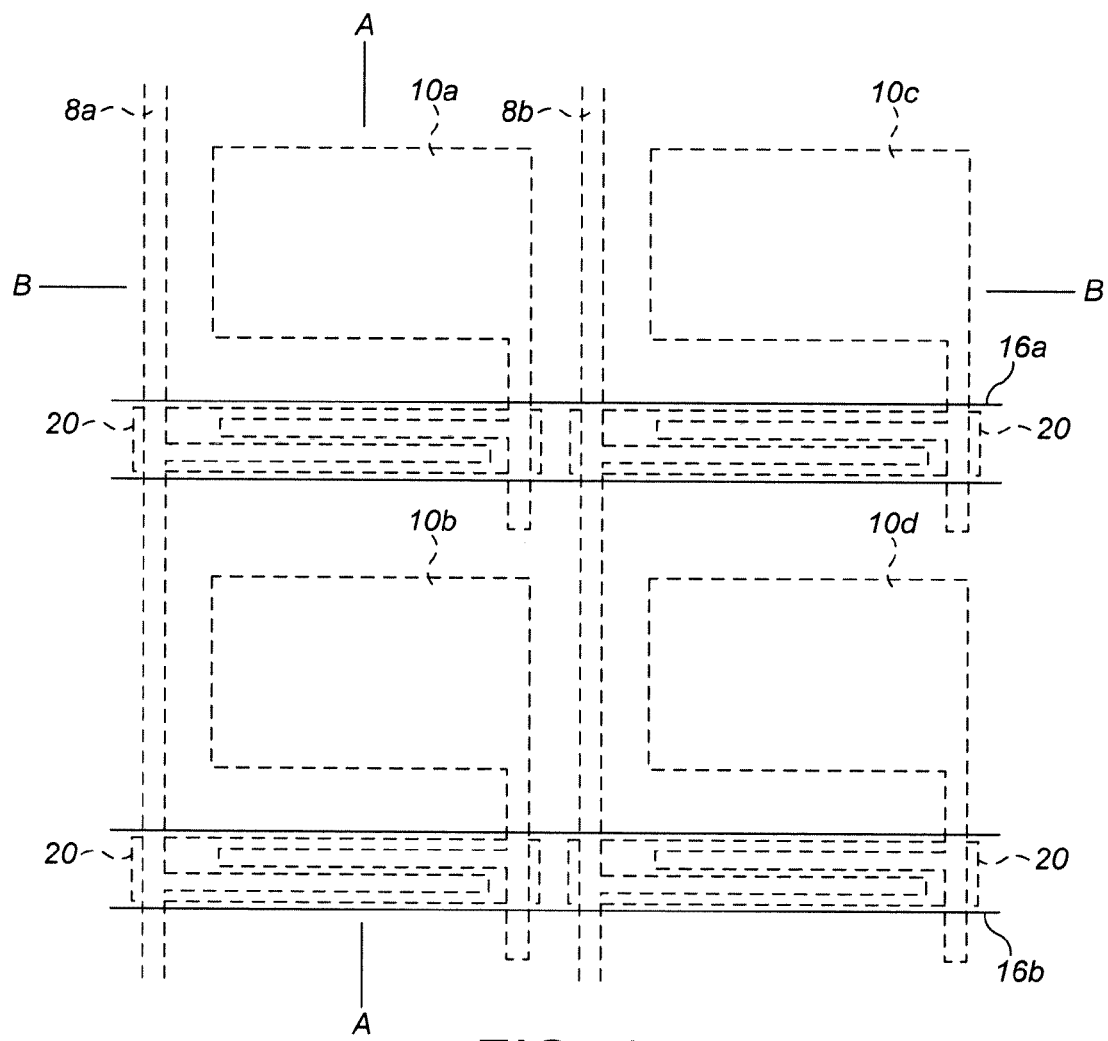
FIG. 1 is a plan view of a device according to a first embodiment of the present invention.
Figure 2:
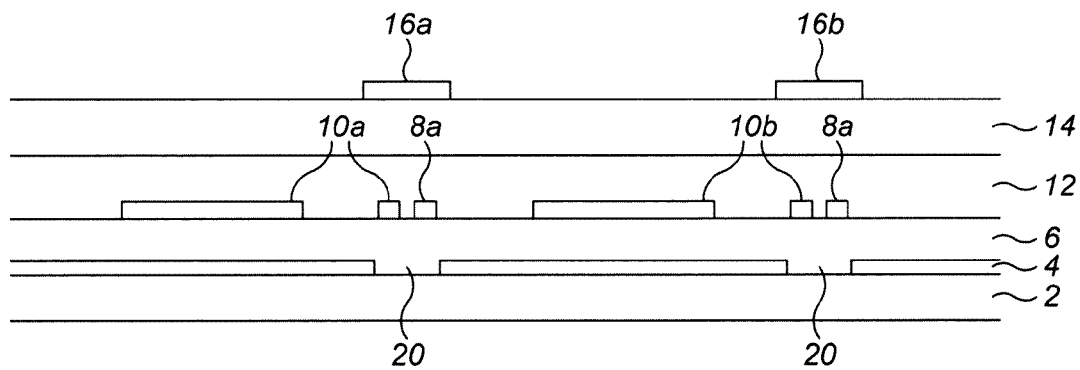
FIGS. 2 and 3 are cross-sectional views of the device of FIG. 1 at lines A and B, respectively.
Figure 3:
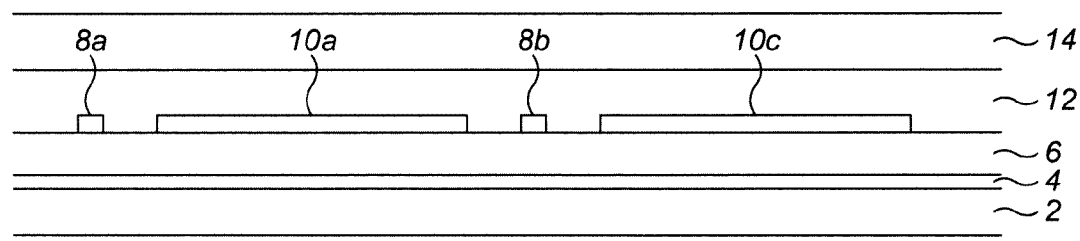

A patterned conductor layer at an intermediate level defines the source and drain electrode circuitry for the TFT array. The source electrode circuitry includes a plurality of independent source electrode conductors 8a, 8b, whose electric potential can be controlled independently of each other. Each source electrode conductor 8a, 8b forms the source electrodes of a respective row of TFTs and an addressing line for that row of TFTs. The drain electrode circuitry includes a plurality of independent drain electrode conductors 10a, 10b, 10c, 10d. Each independent drain electrode conductor 10 forms the drain electrode of a respective TFT and provides a conductive path to other elements of the TFT array, such as a respective pixel electrode at a higher level. For the sake of clarity, the pixel electrodes and interlayer connections between the pixel electrodes and the drain electrode conductors are not shown in the drawings.

Over the source and drain electrode circuitry is formed a blanket layer of semiconductor material 12, which provides the semiconductor channels between the source and drain electrodes of each TFT. The semiconductor channels are the portions of the semiconductor layer connecting portions of the source and drain electrode circuitry that are deliberately arranged very close to each other (e.g. a separation of 20 microns or less) to form the source and drain electrodes of the respective TFT. The semiconductor layer 12 may be formed over substantially the entire area of the footprint of the TFTs, and more particularly over all the areas between the source electrode circuitry and drain electrode circuitry. A gate dielectric layer 14 is formed over the semiconductor layer 12. Another patterned conductor layer is formed on the opposite side of the gate dielectric layer 14 to the semiconductor layer 12 and defines an array of independent gate lines 16a, 16b, each gate line extending over the semiconductor channels of a respective column of TFTs. The electric potential of each gate line 16 can be controlled independently of the others, and the gate lines 16 are used to switch the semiconductor channels of the respective column of TFTs between two or more levels of conductance. For example, the gate lines 16 are used to switch the respective columns of TFTs between on and off states.

On the opposite side of the patterned conductor layer defining the source and drain electrode circuitry to the semiconductor layer 12 is formed a further dielectric layer 6 and a third patterned conductor layer 4 capacitatively coupled to the semiconductor layer 12 via the further dielectric layer 6. All the above-mentioned layers are supported on a substrate 2. This third patterned conductor layer 4 is the first of the above-mentioned three patterned conductor layers to be formed in the example shown in the drawings. The third patterned conductor layer defines windows 20 corresponding to the locations of each semiconductor channel of the TFT array. The third patterned conductor layer 4 extends across substantially the whole area of the semiconductor layer between the source and drain electrode circuitry for the plurality of transistors except for the semiconductor channels. In particular, the third patterned conductor layer extends across each and every area where the source and drain electrode circuitry is closest to each other outside of the areas overlapped by the gate lines 16.

The operation of the TFT array involves changing the electric potential of the gate lines 16 (and thereby switching the semiconductor channels of the TFTs between two or more levels of conductance), whilst maintaining the electric potential of the third patterned conductor layer at a substantially constant value that acts to capacitatively induce in the portions of the semiconductor layer 12 overlapped by the third patterned conductor layer 4 a reduction in the conductance of these portions of the semiconductor layer 12. This reduction in the conductance of these portions serves to suppress leakage currents between source and drain electrode circuitry 8, 10 via the semiconductor layer 12, which leakage currents can cause undesirable cross-talk between TFTs and undesirable leakage of charge from storage capacitors; and also to suppress leakage currents between source electrode conductors (source addressing lines), particularly at the periphery of the pixel array, which suppression has the advantage of reducing power consumption.

For the example that the semiconductor material is a p-type semiconductor, applying a high positive bias voltage to the third patterned conductor layer serves to reduce the conductance of the semiconductor material. The high positive voltage applied to the third patterned conductor layer 4 fully depletes the semiconductor of free positive charge carriers and in that way reduces the conductance of the semiconductor 12. The ratio of (i) this positive voltage to (ii) the thickness of the dielectric layer 6 between the third patterned conductor layer 4 and the semiconductor layer 12 is chosen to be of the same order as the ratio of (iii) the voltage (Vgate_off) applied to the gate lines 16 to switch the respective row of TFTs to an off-state to (iv) the thickness of the gate dielectric layer between the source/drain electrode circuitry 8, 10 and the gate lines 16.

In contrast to the source electrode and drain electrode conductors 8, 10, the third patterned conductor layer 4 is continuous over all TFTs in the array, and only one contact to the third patterned conductor layer 4 is needed to apply the necessary electric potential to suppress the above-mentioned leakage currents between conductors at the source-drain level via the semiconductor layer in substantially all areas outside the area of the gate electrode circuitry 16.

Furthermore, the electrical power consumed by the application of the above-mentioned high positive voltage to the third patterned conductor layer 4 is low because there is no direct current flowing in the third patterned conductor layer 4 and there is no switching of the voltage applied to the third patterned conductor layer 4 during operation of the TFT array.

The level at which the third patterned conductor layer 4 is provided may also include one or more independent conductors outside the area of the TFT array for serving as bottom gate electrodes for additional bottom-gate TFTs providing logic circuitry to support the operation of the TFT array.

In the example described above and illustrated in the drawings, the third patterned conductor layer is provided on the same side of the substrate as the conductor layer defining the source and drain conductors. According to one variation, the third patterned conductor layer is formed on the opposite side of the substrate to the source and drain conductors, and the support substrate 2 additionally functions as the dielectric between the third patterned conductor layer and the semiconductor layer.

In the example described above and illustrated in the drawings, the TFT array is an array of top-gate TFTs. However, the same technique is equally applicable to arrays of bottom-gate TFTs; in the case of bottom-gate TFT arrays, the third patterned conductor layer would be the last of the three patterned conductor layers to be formed, and would be formed at a level above the patterned conductor layer defining the source and drain conductors.

In addition to any modifications explicitly mentioned above, it will be evident to a person skilled in the art that various other modifications of the described embodiment may be made within the scope of the invention.

The invention claimed is:

1. A method of operating a device comprising a patterned conductor layer defining source electrode circuitry and drain electrode circuitry for a plurality of transistors; a semiconductor layer providing a respective semiconductor channel for each transistor between source electrode circuitry and drain electrode circuitry; and gate electrode circuitry overlapping the semiconductor channels of the plurality of transistor devices for switching the semiconductor channels between two or more levels of conductance; wherein said semiconductor layer extends beyond said semiconductor channels to other areas between said source electrode circuitry and drain electrode circuitry; and wherein the method comprises using one or more further conductors independent of said gate electrode circuitry to capacitatively induce a reduction in conductivity of said one or more other areas of said semiconductor layer.

2. The method according to claim 1, wherein said one or more other areas of the semiconductor layer include one or more areas outside the area of the gate electrode circuitry.

3. The method according to claim 2, wherein said one or more other areas include one or more areas where the source and drain electrode circuitry is closest to each other outside the area of the gate electrode circuitry.

4. The method according to claim 1, comprising: capacitatively inducing a reduction in conductivity of said one or more other areas of said semiconductor layer whilst simultaneously using said gate electrode circuitry to capacitatively induce a change in conductivity of one or more of said semiconductor channels.

5. The method according to claim 1, wherein said one or more further conductors are provided on the opposite side of the patterned conductor layer to the gate electrode circuitry.

6. The method according to claim 5, wherein said one or more further conductors comprises a conductor layer extending over substantially all of the area between the source and drain electrode circuitry for the plurality of transistors except for the semiconductor channels.

7. A control device, comprising:
- a first patterned conductor layer defining source electrode circuitry and drain electrode circuitry for a plurality of transistor devices;
- a semiconductor layer providing a respective semiconductor channel for each transistor device between source electrode circuitry and drain electrode circuitry for the same transistor device; and
- a second patterned conductor layer defining gate electrode circuitry for capacitative coupling with the semiconductor channels of the plurality of transistor devices and switching the semiconductor channels between two or more levels of conductance;

wherein said semiconductor layer extends beyond said semiconductor channels to other areas between said source electrode circuitry and drain electrode circuitry; and wherein the device further comprises a third patterned conductor layer arranged on the opposite side of the semiconductor layer to the second patterned conductor layer, wherein the third patterned conductor layer extends over substantially the whole area between the source and drain electrode circuitry for the plurality of transistors, except for the semiconductor channels.

* * * * *